United States Patent
Sung

(10) Patent No.: US 8,777,699 B2
(45) Date of Patent: Jul. 15, 2014

(54) SUPERABRASIVE TOOLS HAVING SUBSTANTIALLY LEVELED PARTICLE TIPS AND ASSOCIATED METHODS

(75) Inventor: Chien-Min Sung, Tansui (TW)

(73) Assignee: RiteDia Corporation, Hsin Chu Industrial Park (TW)

( * ) Notice: Subject to any disclaimer, the term of this patent is extended or adjusted under 35 U.S.C. 154(b) by 202 days.

(21) Appl. No.: 13/239,198

(22) Filed: Sep. 21, 2011

(65) Prior Publication Data

US 2012/0244790 A1    Sep. 27, 2012

Related U.S. Application Data

(60) Provisional application No. 61/384,976, filed on Sep. 21, 2010, provisional application No. 61/468,917, filed on Mar. 29, 2011.

(51) Int. Cl.
    *B24B 53/12* (2006.01)
(52) U.S. Cl.
    USPC ............................ 451/443; 451/444; 451/548
(58) Field of Classification Search
    CPC ........ B24B 53/07; B24B 53/017; B24B 53/12
    USPC ................... 451/443, 444, 548; 501/309, 298
    See application file for complete search history.

(56) References Cited

U.S. PATENT DOCUMENTS

| 187,593 A | 2/1877 | Brown et al. |
|---|---|---|
| 1,854,071 A | 4/1932 | Schacht |
| 1,988,065 A | 1/1935 | Wooddell |
| 2,027,087 A | 1/1936 | Buckner |
| 2,027,307 A | 1/1936 | Schacht |
| 2,033,991 A | 3/1936 | Melton |
| 2,035,521 A | 3/1936 | Benner |
| RE20,660 E | 2/1938 | Schacht |
| 2,184,348 A | 12/1939 | Kirchner |
| 2,187,624 A | 1/1940 | Melton |
| 2,194,253 A | 3/1940 | Benner |
| 2,268,663 A | 1/1942 | Kuzmick |
| 2,281,558 A | 5/1942 | Cross |

(Continued)

FOREIGN PATENT DOCUMENTS

| CN | 1351922 | 6/2002 |
|---|---|---|
| CN | 1494984 | 5/2004 |

(Continued)

OTHER PUBLICATIONS

U.S. Appl. No. 12/168,110, filed Jul. 5, 2008; Chien-Min Sung; office action issued May 14, 2012.

(Continued)

*Primary Examiner* — George Nguyen
(74) *Attorney, Agent, or Firm* — Thorpe North & Western LLP

(57) ABSTRACT

Superabrasive tools and methods for making and using the same are provided. In one aspect, for example, a CMP pad dresser includes a first monolayer of superabrasive particles disposed on and coupled to one side of a metal support layer and a second monolayer of superabrasive particles disposed on and coupled to the metal support layer on an opposite side from the first monolayer. The superabrasive particles of the second monolayer are positioned to have substantially the same distribution as the superabrasive particles of the first monolayer.

19 Claims, 2 Drawing Sheets

(56) References Cited

U.S. PATENT DOCUMENTS

| | | | |
|---|---|---|---|
| 2,307,461 A * | 1/1943 | Durward | 51/295 |
| 2,318,570 A | 5/1943 | Carlton | |
| 2,334,572 A | 11/1943 | Melton | |
| 2,612,348 A | 9/1952 | Catallo | |
| 2,725,693 A | 12/1955 | Smith | |
| 2,811,960 A | 11/1957 | Fessel | |
| 2,867,086 A | 1/1959 | Haley | |
| 2,876,086 A | 3/1959 | Raymond | |
| 2,947,608 A | 8/1960 | Hall | |
| 2,652,951 A | 9/1960 | Simpson | |
| 2,952,951 A | 9/1960 | Simpson | |
| 3,067,551 A | 12/1962 | Maginnis | |
| 3,121,981 A | 2/1964 | Hurst | |
| 3,127,715 A | 4/1964 | Christensen | |
| 3,146,560 A | 9/1964 | Hurst | |
| 3,276,852 A | 10/1966 | Lemelson | |
| 3,293,012 A | 12/1966 | Smiley | |
| 3,372,010 A | 3/1968 | Parsons | |
| 3,377,411 A | 4/1968 | Charvat | |
| 3,416,560 A | 12/1968 | Bruno | |
| 3,440,774 A | 4/1969 | Curn | |
| 3,608,134 A | 9/1971 | Cook | |
| 3,625,666 A | 12/1971 | James | |
| 3,630,699 A | 12/1971 | Caitlin | |
| 3,631,638 A | 1/1972 | Yoshikawa et al. | |
| 2,078,354 A | 4/1973 | Webster | |
| 3,743,489 A | 7/1973 | Wentorf et al. | |
| 3,767,371 A | 10/1973 | Wentorf et al. | |
| 3,802,130 A | 4/1974 | Lindenbeck | |
| 3,819,814 A | 6/1974 | Pope | |
| 3,852,078 A | 12/1974 | Wakatsuki | |
| 3,894,673 A | 7/1975 | Lowder et al. | |
| 3,982,358 A | 9/1976 | Fukuda | |
| 4,018,576 A | 4/1977 | Lowder et al. | |
| 4,078,906 A | 3/1978 | Green | |
| 4,149,881 A | 4/1979 | D'Silva | |
| 4,182,628 A | 1/1980 | D'Silva | |
| 4,188,194 A | 2/1980 | Gorrigan | |
| 4,211,294 A | 7/1980 | Multakh | |
| 4,211,924 A | 7/1980 | Muller et al. | |
| 4,224,380 A | 9/1980 | Bovenkerk et al. | |
| 4,228,214 A | 10/1980 | Steigleman et al. | |
| 4,229,186 A | 10/1980 | Wilson | |
| 4,273,561 A | 6/1981 | Villalobos | |
| 4,287,168 A | 9/1981 | Wentorf et al. | |
| 4,289,503 A | 9/1981 | Corrigan | |
| 4,341,532 A | 7/1982 | Oide | |
| 4,355,489 A | 10/1982 | Heyer et al. | |
| 4,481,016 A | 11/1984 | Campbell et al. | |
| 4,525,179 A | 6/1985 | Gigl | |
| 4,547,257 A | 10/1985 | Iizuka et al. | |
| 4,551,195 A | 11/1985 | Iizuka et al. | |
| 4,565,034 A | 1/1986 | Sekiya | |
| 4,610,699 A | 9/1986 | Yazu et al. | |
| 4,617,181 A | 10/1986 | Yazu et al. | |
| 4,629,373 A | 12/1986 | Hall | |
| 4,632,817 A | 12/1986 | Yazu et al. | |
| 4,662,896 A | 5/1987 | Mahlon | |
| 4,669,522 A | 6/1987 | Griffin | |
| 4,680,199 A | 7/1987 | Vontell et al. | |
| 4,712,552 A | 12/1987 | Pangburn | |
| 4,749,514 A | 6/1988 | Murakami et al. | |
| 4,770,907 A | 9/1988 | Kimura | |
| 4,776,861 A | 10/1988 | Frushour | |
| 4,780,274 A | 10/1988 | Barr | |
| 4,797,241 A | 1/1989 | Peterson et al. | |
| 4,828,582 A | 5/1989 | Frushour | |
| 4,849,602 A | 7/1989 | Gardner | |
| 4,866,888 A | 9/1989 | Murai et al. | |
| 4,883,500 A | 11/1989 | Deakins et al. | |
| 4,908,046 A | 3/1990 | Wiand | |
| 4,916,869 A | 4/1990 | Oliver | |
| 4,923,490 A | 5/1990 | Johnson et al. | |
| 4,925,457 A | 5/1990 | deKok et al. | |
| 4,927,619 A | 5/1990 | Tsuji | |
| 4,943,488 A | 7/1990 | Sung et al. | |
| 4,945,686 A | 8/1990 | Wiand | |
| 4,949,511 A | 8/1990 | Endo et al. | |
| 4,954,139 A | 9/1990 | Cerutti | |
| 4,968,326 A | 11/1990 | Wiand | |
| 5,000,273 A | 3/1991 | Horton et al. | |
| 5,011,513 A | 4/1991 | Zador et al. | |
| 5,022,895 A | 6/1991 | Wiand | |
| 5,024,680 A | 6/1991 | Chen et al. | |
| 5,030,276 A | 7/1991 | Sung et al. | |
| 5,037,451 A | 8/1991 | Burnand et al. | |
| 5,043,120 A | 8/1991 | Corrigan | |
| 5,049,165 A | 9/1991 | Tselesin | |
| 5,092,082 A | 3/1992 | Padberg | |
| 5,092,910 A | 3/1992 | deKok et al. | |
| 5,116,568 A | 5/1992 | Sung | |
| 5,131,924 A | 7/1992 | Wiand | |
| 5,133,782 A | 7/1992 | Wiand | |
| 5,137,543 A | 8/1992 | Heath et al. | |
| 5,151,107 A | 9/1992 | Cho et al. | |
| 5,164,247 A | 11/1992 | Solanki et al. | |
| 5,176,155 A | 1/1993 | Rudolph, Jr. | |
| 5,190,568 A | 3/1993 | Tselesin | |
| 5,194,070 A | 3/1993 | Sumiya et al. | |
| 5,194,071 A | 3/1993 | Corrigan et al. | |
| 5,195,403 A | 3/1993 | Sani et al. | |
| 5,195,404 A | 3/1993 | Notter et al. | |
| 5,197,249 A | 3/1993 | Wiand | |
| 5,203,881 A | 4/1993 | Wiand | |
| 5,232,320 A | 8/1993 | Tank et al. | |
| 5,243,790 A | 9/1993 | Gagne | |
| 5,246,884 A | 9/1993 | Jaso | |
| 5,247,765 A | 9/1993 | Quintana | |
| 5,248,317 A | 9/1993 | Tank | |
| 5,264,011 A | 11/1993 | Brown et al. | |
| 5,266,236 A | 11/1993 | Bovenkerk | |
| 5,271,547 A | 12/1993 | Carlson | |
| 5,273,730 A | 12/1993 | Yoshida et al. | |
| 5,295,402 A | 3/1994 | Bovenkerk | |
| 5,314,513 A | 5/1994 | Miller | |
| 5,328,548 A | 7/1994 | Tsuji et al. | |
| 5,364,423 A | 11/1994 | Bigelow et al. | |
| 5,374,293 A | 12/1994 | Takashita et al. | |
| 5,380,390 A | 1/1995 | Tselesin | |
| 5,443,032 A | 8/1995 | Vichr et al. | |
| 5,453,106 A | 9/1995 | Roberts | |
| 5,454,343 A | 10/1995 | Eun et al. | |
| 5,458,754 A | 10/1995 | Sathrum et al. | |
| 5,486,131 A | 1/1996 | Cesna et al. | |
| 5,492,771 A * | 2/1996 | Lowder et al. | 428/565 |
| 5,492,774 A | 2/1996 | Lowder et al. | |
| 5,505,272 A | 4/1996 | Clark | |
| 5,518,443 A | 5/1996 | Fisher | |
| 5,527,424 A | 6/1996 | Mullins | |
| 5,536,202 A | 7/1996 | Appel et al. | |
| 5,547,417 A | 8/1996 | Breivogel et al. | |
| 5,551,959 A | 9/1996 | Martin et al. | |
| 5,560,745 A | 10/1996 | Roberts | |
| 5,560,754 A | 10/1996 | Johnson et al. | |
| 5,609,286 A | 3/1997 | Anthon | |
| 5,620,489 A | 4/1997 | Tselesin | |
| 5,660,894 A | 8/1997 | Chen et al. | |
| 5,674,572 A | 10/1997 | Sarin et al. | |
| 5,725,421 A | 3/1998 | Goers et al. | |
| 5,746,931 A | 5/1998 | Graebner | |
| RE35,812 E | 6/1998 | Oliver | |
| 5,772,756 A | 6/1998 | Davies et al. | |
| 5,779,743 A | 7/1998 | Wood | |
| 5,791,975 A | 8/1998 | Cesna et al. | |
| 5,801,073 A | 9/1998 | Robbins et al. | |
| 5,816,891 A | 10/1998 | Woo | |
| 5,820,450 A | 10/1998 | Calhoun | |
| 5,833,519 A | 11/1998 | Moore | |
| 5,851,138 A | 12/1998 | Hempel, Jr. | |
| 5,855,314 A | 1/1999 | Shiue et al. | |
| 5,885,137 A | 3/1999 | Ploessl | |
| 5,902,173 A | 5/1999 | Tanaka | |
| 5,916,011 A | 6/1999 | Kim | |
| 5,921,856 A | 7/1999 | Zimmer | |

(56) References Cited

U.S. PATENT DOCUMENTS

| | | |
|---|---|---|
| 5,924,917 A | 7/1999 | Benedict et al. |
| 5,961,373 A | 10/1999 | Lai |
| 5,975,988 A | 11/1999 | Christianson |
| 5,976,205 A | 11/1999 | Andrews et al. |
| 5,980,852 A | 11/1999 | Gurns et al. |
| 5,980,982 A | 11/1999 | Degawa et al. |
| 5,985,228 A | 11/1999 | Corrigan et al. |
| 6,001,008 A | 12/1999 | Fujimori et al. |
| 6,001,174 A | 12/1999 | Fang |
| 6,024,824 A | 2/2000 | Krech |
| 6,027,659 A | 2/2000 | Billet |
| 6,030,595 A | 2/2000 | Sumiya et al. |
| 6,039,641 A | 3/2000 | Sung |
| 6,054,183 A | 4/2000 | Zimmer et al. |
| 6,093,280 A | 7/2000 | Kirchner et al. |
| 6,106,382 A | 8/2000 | Sakaguchi |
| 6,123,612 A | 9/2000 | Goers |
| 6,159,286 A | 12/2000 | Sung |
| 6,179,886 B1 | 1/2001 | Gordeev et al. |
| 6,190,240 B1 | 2/2001 | Kinoshita et al. |
| 6,196,911 B1 | 3/2001 | Preston et al. |
| 6,206,942 B1 | 3/2001 | Wood et al. |
| 6,213,856 B1 | 4/2001 | Cho et al. |
| 6,217,413 B1 | 4/2001 | Christianson |
| 6,224,469 B1 | 5/2001 | Ohmori et al. |
| 6,258,138 B1 | 7/2001 | DeVoe et al. |
| 6,258,201 B1 | 7/2001 | Krech |
| 6,258,237 B1 | 7/2001 | Gal-Or et al. |
| 6,281,129 B1 | 8/2001 | Easter et al. |
| 6,284,556 B1 | 9/2001 | Wang et al. |
| 6,286,498 B1 | 9/2001 | Sung |
| 6,293,854 B1 | 9/2001 | Kimura et al. |
| 6,299,508 B1 | 10/2001 | Gagliardi et al. |
| 6,319,108 B1 | 11/2001 | Adefris et al. |
| 6,325,709 B1 | 12/2001 | Nanda et al. |
| 6,346,202 B1 | 2/2002 | Molnar |
| 6,354,918 B1 | 3/2002 | Togawa et al. |
| 6,368,198 B1 | 4/2002 | Sung et al. |
| 6,371,838 B1 | 4/2002 | Holzapfel |
| 6,371,842 B1 | 4/2002 | Romero |
| 6,394,886 B1 | 5/2002 | Chen et al. |
| 6,409,580 B1 | 6/2002 | Lougher et al. |
| 6,439,986 B1 | 8/2002 | Myoung et al. |
| 6,446,740 B2 | 9/2002 | Eyre |
| 6,478,831 B2 | 11/2002 | Tselesin |
| 6,497,853 B1 | 12/2002 | Davies et al. |
| 6,544,599 B1 | 4/2003 | Brown et al. |
| 6,551,176 B1 | 4/2003 | Garretson |
| 6,605,798 B1 | 8/2003 | Cullen |
| 6,607,423 B1 | 8/2003 | Areayan et al. |
| 6,616,725 B2 | 9/2003 | Cho et al. |
| 6,616,752 B1 | 9/2003 | Cho et al. |
| 6,626,167 B2 | 9/2003 | Kim et al. |
| 6,627,168 B1 | 9/2003 | Ohtsubo et al. |
| 6,672,943 B2 | 1/2004 | Vogtmann |
| 6,679,243 B2 | 1/2004 | Sung |
| 6,692,547 B2 * | 2/2004 | Kim ........................... 51/298 |
| 6,694,847 B2 | 2/2004 | Hiroyasu et al. |
| 6,749,485 B1 | 6/2004 | James et al. |
| 6,755,720 B1 | 6/2004 | Ishizaki et al. |
| 6,790,126 B2 | 9/2004 | Wood et al. |
| 6,818,029 B2 | 11/2004 | Myoung et al. |
| 6,824,455 B2 | 11/2004 | Osterheld et al. |
| 6,835,365 B1 | 12/2004 | Davies et al. |
| 6,884,155 B2 | 4/2005 | Sung et al. |
| 6,899,592 B1 | 5/2005 | Kojima et al. |
| 6,905,571 B2 | 6/2005 | Sakuma et al. |
| 6,945,857 B1 | 9/2005 | Doan et al. |
| 6,979,357 B2 | 12/2005 | Fries et al. |
| 7,021,995 B2 | 4/2006 | Toge et al. |
| 7,033,408 B2 | 4/2006 | Fries et al. |
| 7,044,990 B2 | 5/2006 | Ishizaki et al. |
| 7,066,795 B2 | 6/2006 | Balagani et al. |
| 7,067,903 B2 | 6/2006 | Takeshi et al. |
| 7,124,753 B2 | 10/2006 | Sung |
| 7,150,677 B2 | 12/2006 | Yamashita |
| 7,198,553 B2 | 4/2007 | Goers |
| 7,201,645 B2 | 4/2007 | Sung |
| 7,258,708 B2 | 8/2007 | Sung |
| 7,261,621 B2 | 8/2007 | Moon et al. |
| 7,323,049 B2 | 1/2008 | Sung |
| 7,368,013 B2 | 5/2008 | Sung |
| 7,384,436 B2 | 6/2008 | Sung |
| 7,404,857 B2 | 7/2008 | Sung |
| 7,465,217 B2 | 12/2008 | Kinoshita et al. |
| 7,494,404 B2 * | 2/2009 | Sung ........................... 451/527 |
| 7,585,366 B2 | 9/2009 | Sung |
| 7,651,386 B2 | 1/2010 | Sung |
| 7,658,666 B2 | 2/2010 | Sung |
| 7,690,971 B2 | 4/2010 | Sung |
| 7,791,188 B2 | 9/2010 | Sung |
| 2001/0003884 A1 | 6/2001 | Wei et al. |
| 2001/0009844 A1 | 7/2001 | Cho et al. |
| 2001/0046835 A1 * | 11/2001 | Wielonski et al. ............ 451/533 |
| 2002/0042200 A1 | 4/2002 | Fawcett |
| 2002/0127962 A1 | 9/2002 | Cho et al. |
| 2002/0139680 A1 * | 10/2002 | George ........................ 205/110 |
| 2002/0173234 A1 * | 11/2002 | Sung et al. ..................... 451/21 |
| 2003/0054746 A1 | 3/2003 | Nussbaumer |
| 2003/0084894 A1 | 5/2003 | Sung |
| 2003/0114094 A1 | 6/2003 | Myoung et al. |
| 2003/0207659 A1 | 11/2003 | Annen et al. |
| 2004/0009742 A1 | 1/2004 | Lin et al. |
| 2004/0060243 A1 | 4/2004 | Fries et al. |
| 2004/0079033 A1 | 4/2004 | Long |
| 2004/0107648 A1 | 6/2004 | Sung |
| 2004/0180617 A1 | 9/2004 | Goers |
| 2004/0203325 A1 | 10/2004 | Donohue |
| 2004/0238946 A1 | 12/2004 | Tachibana et al. |
| 2005/0032462 A1 | 2/2005 | Gagliardi et al. |
| 2005/0060941 A1 | 3/2005 | Provow |
| 2005/0118939 A1 | 6/2005 | Duescher |
| 2005/0215188 A1 | 9/2005 | Toge et al. |
| 2005/0260939 A1 | 11/2005 | Andrews et al. |
| 2006/0073774 A1 | 4/2006 | Sung |
| 2006/0079160 A1 | 4/2006 | Balagani et al. |
| 2006/0079162 A1 | 4/2006 | Yamashita et al. |
| 2006/0128288 A1 | 6/2006 | An et al. |
| 2006/0135050 A1 | 6/2006 | Petersen et al. |
| 2006/0143991 A1 | 7/2006 | Sung |
| 2006/0254154 A1 | 11/2006 | Huang et al. |
| 2006/0258276 A1 | 11/2006 | Sung |
| 2007/0051354 A1 | 3/2007 | Sung |
| 2007/0051355 A1 | 3/2007 | Sung |
| 2007/0060026 A1 | 3/2007 | Sung |
| 2007/0066194 A1 | 3/2007 | Wielonski et al. |
| 2007/0093181 A1 | 4/2007 | Lugg et al. |
| 2007/0128994 A1 | 6/2007 | Sung |
| 2007/0155298 A1 | 7/2007 | Sung |
| 2007/0232074 A1 | 10/2007 | Kramadhati et al. |
| 2007/0249270 A1 | 10/2007 | Sung |
| 2007/0254566 A1 | 11/2007 | Sung |
| 2007/0264918 A1 | 11/2007 | Sung |
| 2007/0266639 A1 | 11/2007 | Sung |
| 2007/0295267 A1 | 12/2007 | Sung |
| 2008/0076338 A1 | 3/2008 | Andrews et al. |
| 2008/0096479 A1 | 4/2008 | Sung |
| 2008/0171503 A1 | 7/2008 | Sung |
| 2008/0271384 A1 | 11/2008 | Puthanangady et al. |
| 2008/0292869 A1 | 11/2008 | Sung |
| 2008/0296756 A1 | 12/2008 | Koch et al. |
| 2009/0068937 A1 | 3/2009 | Sung |
| 2009/0093195 A1 | 4/2009 | Sung |
| 2009/0145045 A1 | 6/2009 | Sung |
| 2009/0283089 A1 | 11/2009 | Sung |
| 2010/0015898 A1 | 1/2010 | An et al. |
| 2010/0022174 A1 * | 1/2010 | Chou et al. .................... 451/548 |
| 2010/0139174 A1 | 6/2010 | Sung |
| 2010/0186479 A1 | 7/2010 | Borucki et al. |
| 2010/0203811 A1 | 8/2010 | Philipossian et al. |
| 2010/0221990 A1 | 9/2010 | Sung |
| 2010/0248595 A1 | 9/2010 | Dinh-Ngoc |
| 2010/0248596 A1 | 9/2010 | Sung |
| 2010/0261419 A1 | 10/2010 | Sung |

(56) References Cited

U.S. PATENT DOCUMENTS

| | | |
|---|---|---|
| 2011/0212670 A1 | 9/2011 | Sung |
| 2011/0275288 A1 | 11/2011 | Sung |
| 2011/0296766 A1 | 12/2011 | Sung |
| 2012/0241943 A1 | 9/2012 | Sung |

FOREIGN PATENT DOCUMENTS

| | | |
|---|---|---|
| EP | 0712941 | 5/1966 |
| EP | 0238434 | 3/1987 |
| EP | 0280657 | 8/1988 |
| EP | 0331344 | 2/1989 |
| EP | 0264674 | 9/1995 |
| GB | 2239011 | 6/1991 |
| JP | 06182184 | 4/1994 |
| JP | 10128654 | 5/1998 |
| JP | 10180618 | 7/1998 |
| JP | 11048122 | 2/1999 |
| JP | 11077536 | 3/1999 |
| JP | 200167774 | 6/2000 |
| JP | 2000343436 | 12/2000 |
| JP | 2003/071718 | 3/2003 |
| JP | 2003/0717189 | 3/2003 |
| JP | 2004/025401 | 1/2004 |
| JP | 2007-044823 | 2/2007 |
| KR | 2002/0036138 | 5/2002 |
| KR | 200339181 | 1/2004 |
| KR | 2007/0063569 | 6/2007 |
| WO | WO94/27883 | 12/1994 |
| WO | WO95/27596 | 10/1995 |
| WO | WO96/06732 | 3/1996 |
| WO | WO98/10897 | 3/1998 |
| WO | WO98/45091 | 3/1998 |
| WO | WO98/51448 | 3/1998 |
| WO | WO98/45092 | 10/1998 |
| WO | WO02/31078 | 4/2002 |
| WO | WO2004/094106 | 11/2004 |
| WO | WO2006/124792 | 11/2006 |
| WO | WO2007/032946 | 3/2007 |
| WO | WO2008/063599 | 5/2008 |

OTHER PUBLICATIONS

U.S. Appl. No. 12/255,823, filed Oct. 22, 2008; Chien-Min Sung; notice of allowance dated Sep. 21, 2012.
U.S. Appl. No. 12/168,110, filed Jul. 5, 2008; Chien-Min Sung; notice of allowance dated Sep. 28, 2012.
U.S. Appl. No. 12/255,823, filed Oct. 22, 2008; Chien-Min Sung; notice of allowance dated Dec. 26, 2012.
U.S. Appl. No. 13/239,189, filed Sep. 21, 2011; Chien-Min Sung; office action dated Dec. 21, 2012.
Colmonoy Technical Data Sheet; No. DSP-A; 1993.
Endecott's Specifications; 2004.
Kennametal Specification for DMHPM002 Hot Press Matrix N-50 Dec. 6, 2001.
Material Safety Data Sheet (MSDS), Wall Colmonoy Corporation; prepared Jul. 20, 1989.
Material Safety Data Sheet MSDS); Kennametal; issued Jun. 11, 2004.
Sung et al.; The Eastern Wind of Diamond Synthesis; New Diamond and Frontier Carpon Technology; 2003; pp. 47-61; vol. 13, No. 1.
Sung et al; Mechanism of the Solvent-Assisted Graphite to Diamond Transition Under High Pressure: Implications for the Selection of Catalysts, High Temperatures-High Pressure; 1995/1996; pp. 523-546; vol. 27/28.
Syndite, CTM302; Announcement, Elementsix Advancing Diamond; Jan. 14, 2003; http://www.e6.com/en/resources/announcementsheets/CTM302.pdf; as accessed on Dec. 16, 2008.
Syndite, Elementsix Advancing Diamond; 2 pages.
U.S. Appl. No. 08/832,852, filed Apr. 4, 1997; Chien-Min Sung.
U.S. Appl. No. 09/447,620, filed Nov. 22, 1999; Chien-Min Sung.
Yasinaga et al; Advances in Abrasive Technology, III; Soc. of Grinding Engineers (SGE) in Japan; 2000.
U.S Appl. No. 11/512/755, filed Aug. 29, 2006; Chien-Min Sung.
PCT/US2012/039199; filed May 23, 2012; Chien-Min Sung; International Search Report dated Dec. 18, 2012.
U.S. Appl. No. 12/168,110, Jul. 5, 2008; Chien-Min Sung; notice of allowance dated Jan. 18, 2013.
PCT Application PCT/US2011/052626; filing date Sep. 21, 2011; Chien-Min Sung; International Search Report mailed May 2, 2012.
PCT Application PCT/US2011/052627; filing date Sep. 21, 2011; Chien Min Sung; International Search Report mailed May 11, 2012.
U.S. Appl. No. 12/726,786, filed Mar. 18, 2010; Chien-Min Sung; office action dated Mar. 19, 2013.
U.S. Appl. No. 13/239,189, filed Sep. 21, 2011; Chien-Min Sung; notice of allowance dated May 3, 2013.
PCT/US2013/042538; filed May 23, 2013; Chien-Min Sung; international search report dated Aug. 27, 2013.
U.S. Appl. No. 12/726,786, filed Mar. 18, 2010; Chien-Min Sung; notice of allowance dated Sep. 4, 2013.
U.S. Appl. No. 13/113,779, filed May 23, 2011; Chien-Min Sung; office action dated Nov. 12, 2013.
U.S. Appl. No. 13/153,176, filed Jun. 3, 2011; Chien-Min Sung; office action dated Dec. 6, 2013.

* cited by examiner

SUPERABRASIVE TOOLS HAVING SUBSTANTIALLY LEVELED PARTICLE TIPS AND ASSOCIATED METHODS

PRIORITY DATA

This application claims the benefit of U.S. Provisional Patent Application Ser. Nos. 61/384,976 and 61/468,917, filed on Sep. 21, 2010 and Mar. 29, 2011 respectively, each of which are incorporated herein by reference.

BACKGROUND OF THE INVENTION

The semiconductor industry currently spends in excess of one billion U.S. dollars each year manufacturing silicon wafers that must exhibit very flat and smooth surfaces. Known techniques to manufacture smooth and even-surfaced silicon wafers are plentiful. The most common of these involves the process known as Chemical Mechanical Polishing (CMP) which includes the use of a polishing pad in combination with an abrasive slurry. Of central importance in all CMP processes is the attainment of high performance levels in aspects such as uniformity of polished wafer, smoothness of the IC circuitry, removal rate for productivity, longevity of consumables for CMP economics, etc.

SUMMARY OF THE INVENTION

The present disclosure provides superabrasive tools and methods for making and using the same. In one aspect, for example, a CMP pad dresser is provided. Such a dresser includes a first monolayer of superabrasive particles disposed on and coupled to one side of a metal support layer and a second monolayer of superabrasive particles disposed on and coupled to the metal support layer on an opposite side from the first monolayer. The superabrasive particles of the second monolayer are positioned to have substantially the same distribution as the superabrasive particles of the first monolayer. In another aspect, the superabrasive particles of the second monolayer are positioned to have the same distribution as the superabrasive particles of the first monolayer. In yet another aspect, a rigid support can be coupled to the second monolayer of superabrasive particles opposite the first monolayer.

Various materials are contemplated for use as superabrasive particles in the first monolayer and/or the second monolayer, and any known superabrasive particle material is considered to be within the present scope. Non-limiting examples of superabrasive particle materials include diamond materials, nitride materials, ceramics, and the like, including combinations thereof. In one specific aspect, the superabrasive particles include a diamond material. In another specific aspect, the superabrasive particles include a cubic boron nitride material.

The present disclosure additionally provides methods of making CMP pad dressers. In one aspect, a method of making a CMP pad dresser can include disposing a first monolayer of superabrasive particles on a metal support layer, and disposing a second monolayer of superabrasive particles on the metal support layer on a side opposite the first monolayer, where the superabrasive particles of the second monolayer are positioned to have substantially the same distribution as the superabrasive particles of the first monolayer. The method further includes bonding the first monolayer of superabrasive particles and the second monolayer of superabrasive particles to the metal support layer such that symmetrical forces due to the substantially similar distribution between the first monolayer and the second monolayer precludes substantial warping of the metal support layer.

The superabrasive particles of the first monolayer and/or the second monolayer can be coupled to the metal support layer using a variety of contemplated techniques. It is understood that any technique for coupling superabrasive particles to a support is considered to be within the present scope. Non-limiting examples can include brazing, pressurized heating, sintering, electroplating, polymeric binding, and the like, including combinations thereof. In one specific aspect, at least one of the first monolayer of superabrasive particles or the second monolayer of superabrasive particles is coupled to the metal support layer with a braze alloy. In another aspect, both the first monolayer of superabrasive particles and the second monolayer of superabrasive particles are coupled to the metal support layer with a braze alloy. In yet another aspect, the bonding of at least one of the first monolayer or the second monolayer is under heat and pressure. In a further aspect, the heat and pressure bonds at least one of the first monolayer or the second monolayer directly to the metal support layer. In another aspect, the bonding of at least one of the first monolayer and the second monolayer further includes disposing a sintering compound on the metal support layer in contact with at least one of the first monolayer or the second monolayer, and sintering the sintering compound to bond the at least one of the first monolayer or the second monolayer to the metal support layer. In one specific aspect the method can also include infiltrating the sintering compound with a braze material during bonding.

In one aspect, the method can further include coupling the second monolayer of superabrasive particles to a rigid support. Various techniques for coupling the rigid support to the second monolayer are contemplated, and any known technique is considered to be within the present scope. Non-limiting aspects of such techniques include hot pressing, brazing, sintering, soldering, electroplating, polymeric binding, and combinations thereof. In one specific aspect, the coupling of the second monolayer of superabrasive particles to the rigid support is accomplished by polymeric bonding.

The present disclosure additionally provides methods of minimizing warpage of a CMP pad dresser during manufacture. In one aspect, such a method can include substantially equalizing warping forces on opposing sides of a metal support layer during bonding of a plurality of superabrasive particles thereto, where warpage of the support layer is minimized during bonding due to the equalized forces on opposing sides. In one specific aspect, substantially equalizing forces includes arranging the plurality of superabrasive particles on opposing sides of the support layer such that the plurality of superabrasive particles has substantially the same distribution on either side of the support layer to substantially equalize warping forces during bonding.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

Figure 1:
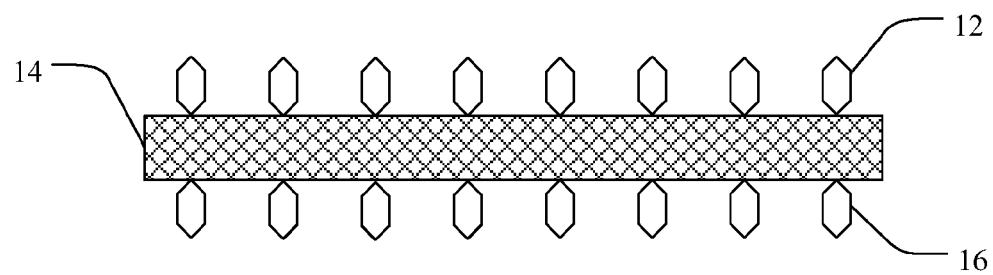
FIG. 1 is a schematic side view of a CMP pad dresser in accordance with an embodiment of the present invention.

It will be understood that the above figures are merely for illustrative purposes in furthering an understanding of the invention. Further, the figures are not drawn to scale, thus dimensions, particle sizes, and other aspects may, and generally are, exaggerated to make illustrations thereof clearer. Therefore, departure can be made from the specific dimensions and aspects shown in the figures in order to produce the heat spreaders of the present invention.

DETAILED DESCRIPTION

Before the present invention is disclosed and described, it is to be understood that this invention is not limited to the particular structures, method steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an" and, "the" include plural referents unless the context clearly dictates otherwise. Thus, for example, reference to "a diamond particle" includes one or more of such particles and reference to "the layer" includes reference to one or more of such layers.

DEFINITIONS

In describing and claiming the present invention, the following terminology will be used in accordance with the definitions set forth below.

As used herein, the terms "conditioner" and "dresser" can be used interchangeably, and refer to a tool used to condition or dress a pad, such as a CMP pad.

As used herein, "superabrasive" may be used to refer to any crystalline, or polycrystalline material, or mixture of such materials which has a Mohr's hardness of about 8 or greater. In some aspects, the Mohr's hardness may be about 9.5 or greater. Such materials include but are not limited to diamond, polycrystalline diamond (PCD), cubic boron nitride (cBN), polycrystalline cubic boron nitride (PcBN), corundum and sapphire, as well as other superabrasive materials known to those skilled in the art. Superabrasive materials may be incorporated into aspects of the present disclosure in a variety of forms including particles, grits, films, layers, pieces, segments, etc.

As used herein, "particle" refers to a particulate form of a material. Such particles may take a variety of shapes, including round, oblong, square, euhedral, etc., can be either single crystal or polycrystalline, and can have a number of mesh sizes. As is known in the art, "mesh" refers to the number of holes per unit area as in the case of U.S. meshes. All mesh sizes referred to herein are U.S. mesh unless otherwise indicated. Further, mesh sizes are generally understood to indicate an average mesh size of a given collection of particles since each particle within a particular "mesh size" may actually vary over a small distribution of sizes.

As used herein, the process of "brazing" is intended to refer to the creation of chemical bonds between the atoms of the superabrasive particles/materials and the braze material. Further, "chemical bond" means a covalent bond, such as a carbide or boride bond, rather than mechanical or weaker inter-atom attractive forces. Thus, when "brazing" is used in connection with superabrasive particles a true chemical bond is being formed. However, when "brazing" is used in connection with metal to metal bonding the term is used in the more traditional sense of a metallurgical bond. Therefore, brazing of a superabrasive segment to a tool body does not necessarily require the presence of a carbide former.

As used herein, "sintering" refers to the joining of two or more individual particles to form a continuous solid mass. The process of sintering involves the consolidation of particles to at least partially eliminate voids between particles. Sintering of diamond particles generally is facilitated by ultrahigh pressures and the presence of a carbon solvent as a diamond sintering aid.

The term "metallic" refers to both metals and metalloids. Metals include those compounds typically considered metals found within the transition metals, alkali and alkali earth metals. Examples of metals are Ag, Au, Cu, Al, and Fe. Metalloids include specifically Si, B, Ge, Sb, As, and Te. Metallic materials also include alloys or mixtures that include metallic materials. Such alloys or mixtures may further include additional additives. In the present invention, carbide formers and carbon wetting agents may be included as alloys or mixtures, but are not anticipated to be the only metallic component. Examples of such carbide formers are Sc, Y, Ti, Zr, Hf, V, Nb, Cr, Mo, Mn, Ta, W, and Tc. Examples of carbon wetting agents are Co, Ni, Mn, and Cr.

As used herein, "infiltrating" refers to when a material is heated to its melting point and then flows as a liquid through the interstitial voids between particles.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum. Furthermore, such an interpretation should apply regardless of the breadth of the range or the characteristics being described.

The Invention

The present disclosure generally provides superabrasive tools and methods for the making and use thereof. In one aspect, such superabrasive tools can include CMP pad dressers that can be utilized in conditioning (e.g., smoothing, polishing, dressing) a CMP pad. CMP pad dressers according to aspects the present disclosure can be advantageously utilized, for example, in dressing CMP pads that are used in polishing, finishing or otherwise affecting semiconductor materials. These dressers can be made such that they have superabrasive particles with substantially leveled tips. Traditional CMP pad dresser manufacturing methods, even many of those describing techniques for leveling superabrasive particle tips prior to fixation, generally contain significant variation in tip height across the surface of the dresser. Often, the superabrasive particles are affixed to the CMP pad dresser support in a manner that disrupts any leveling that has occurred. For example, fixation techniques that utilize high heat and/or pressure can cause warping of the dresser support as the dresser cools. Thus, unless steps are taken to avoid such warpage, superabrasive particles are not maintained in their leveled state following cooling of the dresser. This can be particularly problematic with brazing techniques.

Accordingly, minimizing the warpage of the metal support layer can maintain a greater degree of leveling of superabrasive particle tips in the finished tool. When heat and/or pressure are used to make a superabrasive tool, warpage of the metal support layer can cause great variations in tip height level, even for those particles that were leveled prior to heating and/or applying pressure. By distributing the warpage forces equally or substantially equally on both sides of the metal support layer through the arrangement of the superabrasive particles, these forces effectively cancel each other with respect to the degree of warping occurring in the metal support layer, thus also minimizing the relative height movement of the superabrasive particles relative to one another.

The present CMP pad dressers include a layer of superabrasive particles having substantially leveled tips across the working surface of the finished CMP pad dresser. A CMP pad dresser having such substantially leveled tip arrangements can have a low scratch rate because superabrasive particles are less likely to pull out of the matrix layer due to their more uniform protrusion distribution compared to traditional dressers. Additionally, the more uniform protrusion distributions of such a dressers allows the conditioning of CMP pads in such a manner as to facilitate good polishing rates while at the same time extending the effective working life of the dresser. These benefits can be affected by, for example, uniform asperity spacing and size distribution in the CMP pad.

In one aspect of the present disclosure, superabrasive tip leveling can be accomplished by manufacturing the CMP pad dresser in such a way that the effects of warpage are minimized. For example, in one aspect a CMP pad dresser can be made in at least a two stage process, where the first stage is performed in a manner that minimizes perturbations of the leveled tips in a process that would normally significantly move the superabrasive tips out of a leveled arrangement, such as, for example, by brazing. The second stage of the process can further enhance the leveling of superabrasive particle tips across the CMP pad dresser.

Various exemplary configurations of CMP pad dressers having substantially leveled tips are contemplated. In one aspect, for example, a CMP pad dresser can include a first monolayer of superabrasive particles disposed on and coupled to one side of a metal support layer and a second monolayer of superabrasive particles disposed on and coupled to the metal support layer on an opposite side from the first monolayer. The superabrasive particles of the second monolayer are positioned to have substantially the same distribution as the superabrasive particles of the first monolayer. In one aspect, a rigid support is coupled to the second monolayer of superabrasive particles opposite the first monolayer to provide support to the dresser. The disposition of a single superabrasive particle layer on each side of the metal support layer can moderate the thermal shrinkage from a high temperature process such as brazing that would otherwise buckle a distribution of diamond on one side. By applying a superabrasive layer to each side of the metal support layer, warping forces such as thermal movement and pressure can be equalized or substantially equalized on both sides. As such, the warpage of the metal or support layer can be minimized. In other words, the forces responsible for warping are applied substantially equally to each side of the metal support layer and can thus cancel one another out, thus minimizing warpage that can otherwise occur.

In one aspect, as is shown in FIG. 1 for example, a first monolayer of superabrasive particles 12 is arranged on a surface of a metal support layer 14. A second monolayer of superabrasive particles 16 is arranged on the metal support layer 14 on a side that is opposite to the first monolayer. As is discussed further below, in some cases the first and second monolayers of superabrasive particles can be arranged such that corresponding superabrasive particles across the metal support layer are in substantial alignment, as is shown in FIG. 1. In other cases, the superabrasive particles of the first and second monolayers can be arranged in a substantially similar distribution, but may or may not be substantially aligned with one another across the metal support layer.

A variety of materials are contemplated for use as superabrasive particles. Any superabrasive known that can be utilized in a CMP pad dresser should be considered to be within the present scope. Non-limiting examples of such materials include diamond materials, nitride materials, ceramics, and the like. In one aspect, the superabrasive particles include diamond materials. Such diamond materials can include natural or synthetic diamond, single crystal, polycrystalline, and the like. In another aspect, the superabrasive particles include cubic boron nitride materials. Additionally, various diamond particles sizes can be used, including mesh sizes such as 10/20, 30/40, 80/90, 90/100, 100/120, 120/140, 140/170, 170/200, 200/230, 230/270, 270/325, and 325/400.

The metal support layer can be any material capable of supporting the diamond monolayer during tool formation. Such materials can include, without limitation, metal materials, metal alloy materials, braze alloy materials, ceramic materials, composites, and the like, including combinations thereof. It should be noted that the metal support layer can be of a variety of configurations. In one aspect, for example, a metal support layer can be a solid metal such as a metal plate or a metal foil. In another aspect, a metal support layer can be a pressed powder. For example, a metal powder can be placed in a mold and cold pressed to form a metal support layer.

Additionally, the metal support layer can be any thickness capable of supporting the superabrasive particles. For example, in one aspect the metal support layer can be greater than about 10 mm thick. In another aspect, the metal support layer can be from about 2 mm thick to about 10 mm thick. In another aspect, the metal support layer can be from about 1 µm to about 200 µm thick. In yet another aspect, the metal support layer can be from about 1 µm to about 100 µm thick. In a further aspect, the metal support layer can be from about 100 µm to about 3 mm. In a yet further aspect, the metal support layer can be from about 500 µm to about 2 mm.

In some aspects, the superabrasive particles of either or both of the monolayers can be arranged into a predetermined pattern. Such a pattern can be a uniformly distributed pattern or a non-uniformly distributed pattern. Additionally, a variety of techniques are contemplated to facilitate the arrangement of superabrasive particles into a predetermined pattern. Predetermined is understood to mean a non-random pattern that has been determined prior to arranging the superabrasive particles. In one aspect, a predetermined pattern can also apply to a predetermined spacing between particles. Non-limiting examples of such techniques include arrangement by a template, arrangement using spots of adhesives, arrangement on a first substrate followed by a pattern specific transfer from the first substrate to the metal support layer, and the like, including combinations thereof. The superabrasive particles from either of the monolayers can be temporarily held in position in the predetermined pattern using a variety of techniques, including, without limitation, adhesives, dimpled locations on the metal support matrix, a supporting compound such as, for example, a wax, and the like, including combinations thereof. In one specific aspect, the superabrasive particles can be temporarily coupled to the metal support layer using an adhesive that then volatilizes away and is eliminated during construction of the dresser.

The disposition of a monolayer of superabrasive particles on each side of the metal layer thus moderates the thermal shrinkage from the brazing temperature that would otherwise buckle a distribution of superabrasive particles arranged on just one side. By applying a monolayer to each side of the metal support layer, warping forces such as thermal movement and pressure can be equalized or substantially equalized on both sides. As such, the warpage of the metal support layer can be minimized. In other words, the forces responsible for warping are applied substantially equally to each side of the metal layer and can thus at least partially cancel one another out, thus minimizing warpage that can otherwise occur. In some aspects, the superabrasive particles making up the monolayers on each side of the metal layer can have matching configurations, patterns, or orientations to one another. In this way there can be a substantially matching spatial arrangement of superabrasive particles on each side of the metal layer. In another aspect, the configurations, patterns, or orientations can be different or varied from one another, or may be partially matching. In yet another aspect, the patterned placement of the superabrasive particles on one side of the metal support layer can be substantially aligned with the pattern of superabrasive particles on the other side of the metal layer so that particle locations match one another. In some aspects, there can be a direct correspondence between the spatial positioning of superabrasive particles on one side of the metal support layer and the spatial positioning of superabrasive particles on the other side of the metal support layer. In another aspect, the patterns of superabrasive particles may match or substantially match one another, but may be offset on opposite sides of the metal support layer so that particle locations do not match one another.

Figure 2:
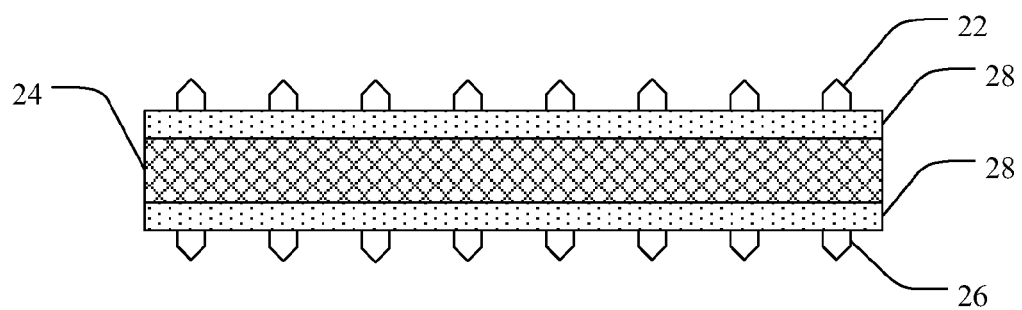
FIG. 2 is a schematic side view of a CMP pad dresser in accordance with an embodiment of the present invention.

In another aspect, as is shown in FIG. 2, a first monolayer of superabrasive particles 22 is arranged on a surface of a metal support layer 24. A second monolayer of superabrasive particles 26 is arranged on the metal support layer 24 on a side that is opposite to the first monolayer. A bonding material 28 secures the first monolayer and the second monolayer to the metal support layer 24. The bonding material can be any material capable of securing the first and second monolayer to the metal support layer. In some aspect, the bonding material can be the same for securing the first monolayer and the second monolayer, while in other aspects the bonding material can be different for securing the first monolayer and the second monolayer.

The bonding material can be any material capable of securing superabrasive particles therein. Non-limiting examples of bonding materials include metal brazes, metal braze alloys, organic matrix materials, sintered materials, electroplated materials, and the like, including combinations thereof.

In one aspect, for example, the superabrasive particles can be brazed to the metal support layer, and thus the bonding material can be a metal braze or metal braze alloy. Metal brazing techniques are known in the art. A green braze material can be applied to the metal support layer on or around the superabrasive particles. The metal braze can be applied in any know configuration, including braze sheets, powders, pastes, sprays, and the like, including combinations thereof. Once applied to the metal support layer, the braze can be heated and melted to coat at least a portion of the metal support layer and to bond the superabrasive particles. The heating temperature can vary depending on the braze material used, but in one aspect can be from about 700° C. to about 1200° C. The superabrasive particles in the first and second monolayer are thus arranged such that thermal forces exerted on the metal support layer during heating and cooling are substantially equalize in order to minimize warping.

In one non-limiting example, the superabrasive particles can be bonded to the metal support layer by brazing with a nickel-based alloy, with or without chromium. In another example, the brazing can include pressing the superabrasive particles with a flat ceramic material that cannot be bonded to the braze in order to level the superabrasive particle tips. Various braze alloys are contemplated, including non-limiting examples such as $BNi_2$, $BNi_7$, and the like.

Additionally, in one aspect at least one of the first and second monolayers of superabrasive particles can be coupled to the metal support layer by an electrodeposition process, and thus the bonding material can be an electrodeposited metal material. In one aspect, a monolayer of superabrasive particles can be disposed on the metal support layer which is then placed into an ionic solution containing metal ions. An electrical current is introduced into the ionic solution such that a metal layer is electroplated onto the metal substrate to secure the superabrasive particles. Thus by this method, the superabrasive particles are coupled to the metal support layer. As an example of a suitable method for positioning and retaining superabrasive materials prior to and during the electrodeposition process, a mold can be used that includes an insulating material that can effectively prevent the accumulation of electrodeposited material on the molding surface. Superabrasive particles can thus be held on the molding surface of the mold during electrodeposition. As such, the accumulation of electrodeposited material can be prevented from occurring on the particle tips and the working surface of the pad conditioner substrate. Such techniques are described in U.S. patent application Ser. No. 11/292,938, filed Dec. 2, 2005, which is hereby incorporated herein by reference.

In another aspect, the superabrasive particles can be bonded to the metal support layer by sintering, and thus the bonding material can include a sintering material. For example, the bonding of the superabrasive particles to the metal support layer can include disposing a sintering compound on the metal support layer in contact with at least one of the first monolayer and the second monolayer and sintering the sintering compound to bond the superabrasive particles to the metal support layer. Suitable sintering methods will be readily appreciated by one of ordinary skill in the art having possession of this disclosure. Basically, a sintering compound is applied around the superabrasive particles and in contact with the metal support layer. The sintering compound can be any known sintering material that can be used to secure superabrasive particles to a substrate. Non-limiting examples of such materials can include metal and metal alloy powders, ceramic powders, and the like. One specific non-limiting example of a sintering compound is cobalt powder. Once the sintering compound has been applied around the superabrasive particles and to the metal support substrate, heat and in some cases pressure can be applied to cause sintering to occur. In some aspects, a braze or braze alloy can be infiltrated into the sintering compound during bonding to further strengthen the bonding material matrix.

Figure 3:
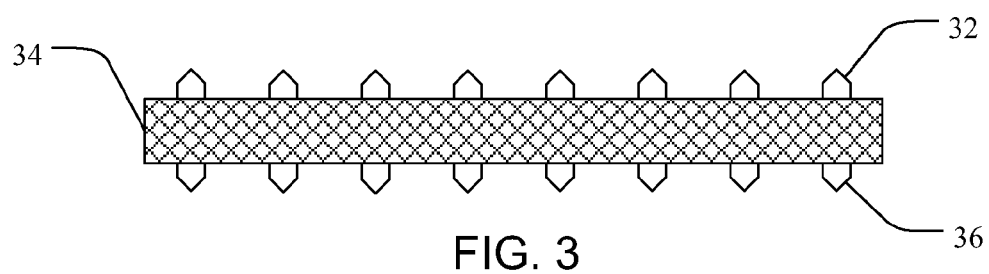
FIG. 3 is a schematic side view of a CMP pad dresser in accordance with an embodiment of the present invention.

In another aspect, as is shown in FIG. 3, heat and pressure can be applied to bond the first monolayer of superabrasive particles 32 and/or the second monolayer of superabrasive particles 36 directly into the metal support layer 34. Thus, upon the application of heat and pressure, the metal support layer 34 is softened or partially melted. The superabrasive particles in one or more of the monolayers are then pressed into the metal support layer. A planar leveling surface can be used to apply pressure to the monolayer and thus maintain the level nature of the superabrasive particle tips as the superabrasive particles are pressed into the metal support layer. Upon cooling, the distribution of superabrasive particles on either side of the metal support layer at least partially equalizes the thermal forces acting on the metal support layer, thus minimizing warping. Additionally, heat and pressures useful in making such a device can vary depending on the materials and equipment used. In one aspect, for example, the heat is from about 700° C. to about 1000° C. In another aspect, the pressure is from about 10 MPa to about 50 MPa.

Figure 4:
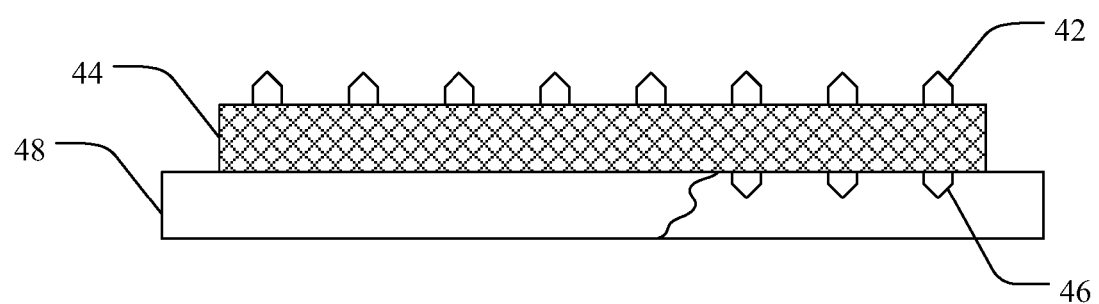
FIG. 4 is a schematic side view of a CMP pad dresser in accordance with an embodiment of the present invention.

In yet another aspect, as is shown in FIG. 4, a CMP pad dresser can include a first monolayer of superabrasive particles 42 and a second monolayer of superabrasive particles 46 coupled to a metal support layer 44. The superabrasive particles can be coupled to the metal support layer directly or via a bonding material. The second monolayer of superabrasive particles 46 is coupled to a rigid support 48. A portion of the rigid support 48 is shown removed in FIG. 4 to expose the second monolayer. The rigid support 48 can facilitate handling and use of the CMP pad dresser. By bonding the superabrasive particles of the second monolayer to the rigid support, the first monolayer of superabrasive particles remains exposed for CMP pad conditioning operations.

The rigid support can be made from any material compatible with the abrading or dressing process. Such materials can include polymeric materials, metal materials, ceramic materials, glasses, composites, and the like. In one aspect, the rigid support can be a polymeric material and the second monolayer of superabrasive particles can be embedded therein using heat, pressure, adhesives, etc. In some aspects, the rigid support can be a non-polymeric material such as a metal layer. In such cases, the superabrasive particles can be bonded to the rigid support by adhesive attachment, soldering, brazing, electroplating, and the like. For brazing techniques, care can be taken to minimize or eliminate warpage in the metal layer during the heating and cooling process. In another aspect, one or more magnetic elements can be placed into the rigid support to attract and hold the CMP pad dresser in place, thus forming a temporary attachment. An optional locking mechanism can be utilized to further immobilize the CMP pad dresser to the rigid support during use. In some aspects the rigid support can include surface features to hold the dresser in place during rotational movement against a CMP pad. The rigid support can have approximately the same diameter as the metal support layer, a larger diameter than the metal support layer, or, in some cases, a smaller diameter than the metal support layer.

Various polymeric materials are contemplated for use as a rigid support. Examples of suitable materials include, without limitation, amino resins, acrylate resins, alkyd resins, polyester resins, polyamide resins, polyimide resins, polyurethane resins, phenolic resins, phenolic/latex resins, epoxy resins, isocyanate resins, isocyanurate resins, polysiloxane resins, reactive vinyl resins, polyethylene resins, polypropylene resins, polystyrene resins, phenoxy resins, perylene resins, polysulfone resins, acrylonitrile-butadiene-styrene resins, acrylic resins, polycarbonate resins, polyimide resins, and mixtures thereof. In one specific aspect, the polymeric material can be an epoxy resin. In another aspect, the polymeric material can be a polyimide resin. In yet another aspect, the polymeric material can be a polyurethane resin.

When an polymeric material is utilized, methods of curing the polymeric material can be a variety of processes known to one skilled in the art that cause a phase transition in the polymeric material from at least a pliable state to at least a rigid state. Curing can occur, without limitation, by exposing the polymeric material to energy in the form of heat, electromagnetic radiation, such as ultraviolet, infrared, and microwave radiation, particle bombardment, such as an electron beam, organic catalysts, inorganic catalysts, or any other curing method known to one skilled in the art.

In one aspect of the present invention, the polymeric material can be a thermoplastic material. Thermoplastic materials can be reversibly hardened and softened by cooling and heating respectively. In another aspect, the polymeric material layer may be a thermosetting material. Thermosetting materials cannot be reversibly hardened and softened as with the thermoplastic materials. In other words, once curing has occurred, the process can be essentially irreversible, if desired.

Additionally, in one aspect a coupling agent or an organometallic compound may be coated onto the surface of a superabrasive material to facilitate the retention of the superabrasive particles in the polymeric material via chemical bonding. A wide variety of organic and organometallic compounds is known to those of ordinary skill in the art and may be used. Organometallic coupling agents can form chemicals bonds between the superabrasive materials and the polymeric material, thus increasing the bonding between the second monolayer of superabrasive particles and the polymeric material. In this way, the organometallic coupling agent can serve as a bridge to form bonds between the polymeric material and the surface of the superabrasive material. In one aspect, the organometallic coupling agent can be a titanate, zirconate, silane, or mixture thereof. The amount of organometallic coupling agent used can depend upon the coupling agent and on the surface area of the superabrasive material. In one aspect, 0.05% to 10% by weight of the polymeric material layer can be sufficient.

In another aspect of the present disclosure, a method of making a CMP pad dresser can include disposing a first monolayer of superabrasive particles on a metal support layer, and disposing a second monolayer of superabrasive particles on the metal support layer on a side opposite the first monolayer. The superabrasive particles of the second monolayer are positioned to have substantially the same distribution as the superabrasive particles of the first monolayer. The method can further include bonding the first monolayer of superabrasive particles and the second monolayer of superabrasive particles to the metal support layer such that symmetrical forces due to the substantially similar distribution between the first monolayer and the second monolayer precludes substantial warping of the metal support layer.

In yet another aspect, disposing at least one of the first monolayer of superabrasive particles or the second monolayer of superabrasive particles can include adhering a plurality of superabrasive particles to an adhesive transfer sheet in a predetermined pattern established by apertures in a template, and removing the template from the adhesive transfer sheet such that the plurality of superabrasive particles remain adhered to the adhesive transfer sheet in the predetermined pattern. The plurality of superabrasive particles is then transferred with the adhesive transfer sheet to the metal support layer, and the adhesive transfer sheet is removed from the plurality of superabrasive particles to form at least one of the first monolayer of superabrasive particles or the second monolayer of superabrasive particles.

In a further aspect of the present disclosure, a method of minimizing warpage of a CMP pad dresser during manufacture can include substantially equalizing warping forces on opposing sides of a metal support layer during bonding of a plurality of superabrasive particles thereto, wherein warpage of the support layer is minimized during bonding due to the equalized forces on opposing sides. In one aspect, substantially equalizing forces includes arranging the plurality of superabrasive particles on opposing sides of the support layer such that the plurality of superabrasive particles has substantially the same distribution on either side of the support layer to substantially equalize warping forces during bonding.

It is noted that, while the above disclosure refers primarily to CMP pad dressers, other precision grinding and/or abrading tools are considered to be within the present scope. As such, the techniques and teaching disclosed herein can additionally be applied to such tools.

The following examples present various methods for making the heat spreaders of the present invention. Such examples are illustrative only, and no limitation on the present invention is meant thereby.

EXAMPLES

Example 1

A thin metal layer (e.g. Cu 100 microns thick) has an adhesive (e.g. 3M manufacture, 25 microns, fugitive, i.e. can vaporize to leave no residue carbon behind) on each side. Ti coated diamond particles (e.g. about 50 microns) are spread on both sides create a diamond particle monolayer on each side. Excess diamond particles are removed. The layer is placed in a graphite mold that is covered with a thin layer of Cu powder. An additional layer of Cu powder is applied on top of the layer. The assembly is then hot pressed (e.g. 900 C for 20 minutes) under vacuum or in an inert atmosphere to form a disk having diamond particles protruding from both sides. Due to the presence of Ti coating, Cu can bond the diamond particles firmly. The flatness of the disk is maintained by the flat mold surface.

Example 2

Same as with Example 1, with the exception that the thin metal Cu layer has a braze alloy layer (e.g. Cu—Sn—Ti or Ag—Cu—Ti) coupled to each side. Uncoated diamond particles are then arranged on the exposed sides of the braze alloy layers with the adhesive. The assembly is then heated to melt the braze in a vacuum furnace, resulting in a copper layer covered with diamond particles on both sides.

Example 3

The diamond-attached layer of Example 2 is suspended in an electrolyte of $CuSO_4$ solution with connection to a cathode. The anode is a copper electrode. After passing current through the electrolyte, Cu will be plated on the copper layer and in the gaps between the diamond particles to strengthen the bonding of the diamond particles to the Cu metal layer.

Example 4

Same as Example 2, with the exception that that the Cu layer is replaced with a thin Ni layer, and the braze layers are Ni—Cr—B—Si (BNi2, e.g. Nichrobraze LM made by Wall Colmonoy), and the diamond particles (e.g. 150 microns) are arranged in a grid pattern (e.g. pitch of 500 microns intervals).

Example 5

The article of Example 4 is pressed against a flat substrate (108 mm in diameter by 6.5 mm in thickness) and heated with a thermal plastic adhesive in between (e.g. 150 C for 10 minutes). The result is a tool such as a CMP pad conditioner having a flat surface. A layer on each side moderates the thermal shrinkage from the brazing temperature (e.g. 1020 C for 10 minutes) that would buckle an asymmetrical distribution of diamond on one side.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A CMP pad dresser, comprising:
  a first monolayer of superabrasive particles disposed on and coupled to one side of a metal support layer; and
  a second monolayer of superabrasive particles disposed on and coupled to the metal support layer on an opposite side from the first monolayer, wherein the superabrasive particles of the second monolayer are positioned to have substantially the same distribution as the superabrasive particles of the first monolayer; and further comprising a rigid support coupled to the second monolayer of superabrasive particles opposite the first monolayer.

2. The dresser of claim 1, wherein the superabrasive particles in the first monolayer include a member selected from the group consisting of diamond materials, nitride materials, ceramics, or a combination thereof.

3. The dresser of claim 1, wherein the superabrasive particles in the first monolayer are a diamond material.

4. The dresser of claim 1, wherein the superabrasive particles in the first monolayer are a cubic boron nitride material.

5. The dresser of claim 1, wherein the superabrasive particles in the second monolayer include a member selected from the group consisting of diamond materials, nitride materials, ceramics, or a combination thereof.

6. The dresser of claim 1, wherein the superabrasive particles in the second monolayer are a diamond material.

7. The dresser of claim 1, wherein the superabrasive particles in the second monolayer are a cubic boron nitride material.

8. The dresser of claim 1, wherein at least one of the first monolayer of superabrasive particles or the second monolayer of superabrasive particles is coupled to the metal support layer with a braze alloy.

9. The dresser of claim 1, wherein both the first monolayer of superabrasive particles and the second monolayer of superabrasive particles are coupled to the metal support layer with a braze alloy.

10. The dresser of claim 1, wherein the superabrasive particles of the second monolayer are positioned to have the same distribution as the superabrasive particles of the first monolayer.

11. A method of making a CMP pad dresser, comprising:
    disposing a first monolayer of superabrasive particles on a metal support layer;
    disposing a second monolayer of superabrasive particles on the metal support layer on a side opposite the first monolayer, wherein the superabrasive particles of the second monolayer are positioned to have substantially the same distribution as the superabrasive particles of the first monolayer;
    bonding the first monolayer of superabrasive particles and the second monolayer of superabrasive particles to the metal support layer such that symmetrical forces due to the substantially similar distribution between the first monolayer and the second monolayer precludes substantial warping of the metal support layer; and
    coupling the second monolayer of superabrasive particles to a rigid support.

12. The method of claim 11, wherein the bonding of at least one of the first monolayer or the second monolayer is by brazing with a braze alloy.

13. The method of claim 11, wherein the bonding of at least one of the first monolayer or the second monolayer is under heat and pressure.

14. The method of claim 13, wherein the bonding of at least one of the first monolayer and the second monolayer further includes:
    disposing a sintering compound on the metal support layer in contact with at least one of the first monolayer or the second monolayer; and
    sintering the sintering compound to bond the at least one of the first monolayer or the second monolayer to the metal support layer.

15. The method of claim 14, further comprising infiltrating the sintering compound with a braze material during bonding.

16. The method of claim 13, wherein the heat and pressure bonds at least one of the first monolayer or the second monolayer directly to the metal support layer.

17. The method of claim 11, wherein the superabrasive particles of the second monolayer are positioned to align with the superabrasive particles of the first monolayer.

18. The method of claim 11, wherein the coupling of the second monolayer of superabrasive particles to the rigid support is accomplished by a technique selected from the group consisting of hot pressing, brazing, sintering, soldering, electroplating, polymeric bonding, and combinations thereof.

19. The method of claim 11, wherein the coupling of the second monolayer of superabrasive particles to the rigid support is accomplished by polymeric bonding.

\* \* \* \* \*